US008837205B2

(12) United States Patent
Pelley et al.

(10) Patent No.: US 8,837,205 B2
(45) Date of Patent: Sep. 16, 2014

(54) MULTI-PORT REGISTER FILE WITH MULTIPLEXED DATA

(75) Inventors: Perry H. Pelley, Austin, TX (US); Ravindraraj Ramaraju, Round Rock, TX (US); Andrew C. Russell, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 183 days.

(21) Appl. No.: 13/483,764

(22) Filed: May 30, 2012

(65) Prior Publication Data

US 2013/0322159 A1    Dec. 5, 2013

(51) Int. Cl.
   *G11C 11/00*    (2006.01)
   *G11C 11/413*   (2006.01)
   *G11C 11/412*   (2006.01)

(52) U.S. Cl.
   CPC ............ *G11C 11/413* (2013.01); *G11C 11/412* (2013.01)
   USPC   365/154; 365/49.1; 365/49.11; 365/189.011; 365/189.02; 365/189.16; 365/189.14; 365/189.17; 365/189.05; 365/230.01; 365/230.02; 365/230.06

(58) Field of Classification Search
   CPC .. G11C 11/412; G11C 11/413; G11C 11/419; G11C 15/04; G11C 15/00; G11C 15/046; G11C 15/043; G11C 7/22; G11C 7/06; G11C 7/1051; G11C 7/12; G11C 7/1066; G11C 7/1006; G11C 7/1078; G11C 7/1012; G11C 7/1096; G11C 7/1048; G11C 7/106; G11C 7/1057; G11C 8/00; G11C 8/04; G11C 7/1045; G11C 8/10; G11C 11/4076; G11C 8/08; G11C 8/12; G11C 8/14; G11C 11/4085; G11C 7/1072; H01L 27/11; H01L 27/1104; G06F 17/30982
   USPC ..................... 365/46, 55, 74, 97, 49.1, 49.11, 365/189.011, 189.02, 189.16, 189.14, 365/189.17, 189.05, 230.01, 230.02, 230.06
   See application file for complete search history.

(56) References Cited

U.S. PATENT DOCUMENTS

| 7,113,421 | B2 * | 9/2006 | Maeda et al. | 365/154 |
| 8,339,838 | B2 * | 12/2012 | Ramaraju | 365/154 |
| 8,498,142 | B2 * | 7/2013 | Murooka | 365/148 |
| 8,555,121 | B2 * | 10/2013 | Seningen et al. | 714/726 |
| 2010/0246735 | A1 * | 9/2010 | Oakley et al. | 375/354 |

OTHER PUBLICATIONS

U.S. Appl. No. 13/441,414, Ashok, A., et al., "Write Contention-Free, Noise-Tolerant Multiport Bitcell", filed Apr. 6, 2012.

* cited by examiner

*Primary Examiner* — Fernando Hidalgo
(74) *Attorney, Agent, or Firm* — James L. Clingan, Jr.; Mary Jo Bertani

(57) ABSTRACT

A semiconductor memory storage device comprises an array of storage devices including a plurality of rows of the storage devices and a plurality of columns of the storage devices, a first plurality of write ports, a write select signal coupled to the write ports, a plurality of write port address lines coupled as input to each of the write ports, and a first plurality of word line select circuits coupled to receive an address signal and the write select signal for each of the write ports and to provide a single selected write word line signal to a respective one of the rows of the storage devices for one of the first plurality of write ports activated by the write select signal.

11 Claims, 4 Drawing Sheets

MULTI-PORT REGISTER FILE WITH MULTIPLEXED DATA

BACKGROUND

1. Field

This disclosure relates generally to semiconductor devices, and more specifically, to multi-port registers.

2. Related Art

Multi-port register files typically have a plurality of bit lines and word lines for each bit cell. The amount of lines running through the array affects the density of the array. It is desirable to reduce the number of lines but it is also desirable to have multiple ports for reading and writing. As the number of ports increases, the memory array tends to require more area. The routing issues become more significant as the number of ports increases.

The multi-port register files have become significant due to the number of different resources needing to write to the registers. Each resource is generating addresses that are more easily managed by keeping the addresses separated. Thus each resource is easier to manage. Thus, there is the contention between needing more ports while not excessively adding area.

Accordingly, there is a need for a register file that improves upon one or more of the issues raised above.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION OF THE DRAWINGS

A multi-port register is responsive to different sources of addresses and data without requiring different write bit lines or different write word lines. Thus, the array of bit cells of the registers have single word line for each row and a single bit line or single bit line pair for each column. This is better understood by reference to the drawings and the following description.

Figure 1:
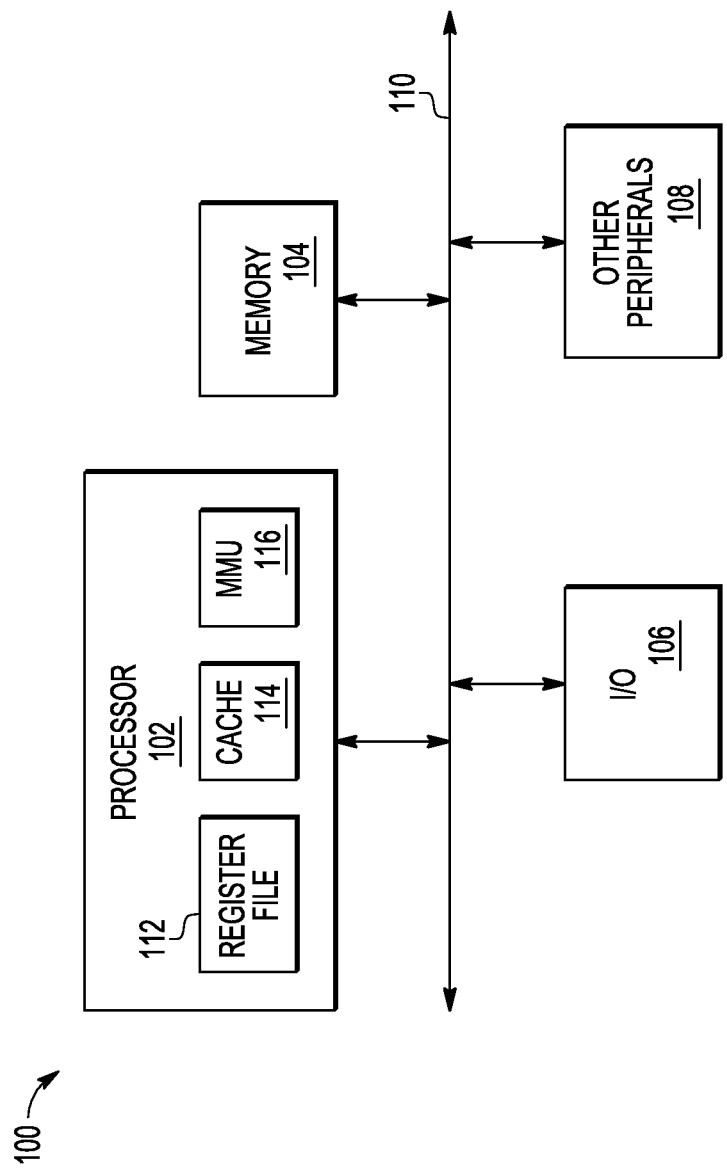
FIG. 1 is a block diagram of a system that includes a multi-port register according to an embodiment.

Shown in FIG. 1 is a computer processing system 100 include processor 102, memory module 104, input/output (I/O) handlers/interfaces 106, and other peripheral devices or modules 108 which are bi-directionally coupled to bus 110 to allow communication between components. Processor 102 includes a register file 112, a Level 1 cache memory modules 114, and a memory management unit (MMU) 116. Processor 102 can be a superscalar processor in which multiple instructions execute out-of-order simultaneously.

Bus 110 may communicate external to computer processing system 100. Alternate embodiments of the present disclosure may use more, less, or different components and functional blocks than those illustrated in FIG. 1. As some possible examples, alternate embodiments of computer processing system 100 may include a timer, a serial peripheral interface, a digital-to-analog converter, an analog-to digital converter, a driver (e.g. a liquid crystal display driver), and/or a plurality of types of memory.

Register file 112 includes registers that are used to temporarily store data and addresses while instructions are executing. Register file 112 can also include checkpoint registers that are used to store the state of the architectural registers when a redirection occurs due to a load instruction exception or a branch instruction misprediction. Any suitable number of registers having any suitable number of bits per register data word can be included in register file 112. For example, in some implementations, there may be 32 registers in which each has 64 bits of data.

MMU 116 is capable of providing various cache memory and bus control signals high-speed as well as virtual address to physical address translation. The virtual address is an address that is generated by processor 102 and as viewed by code that is executed by processor 102. The physical address is used to access the various higher-level memory banks such as a level-one RAM memory.

In alternate embodiments, computer processing system 100 may include one, two, or any number of processors 102. If a plurality of processors 102 are used in computer processing system 100, any number of them may be the same, or may be different. Note that although computer processing system 100 may have a plurality of processors 102, a single processor 102 which by itself can execute a plurality of instruction sets.

Memory module 104 can include a multi-level cache architecture including one or more levels of instruction cache and data cache module that have slower access rates than Level 1 cache modules 114. Memory module 104 can also include an external memory that is also referred to as a main memory and can optionally include additional devices such as buffers and the like.

Figure 2:
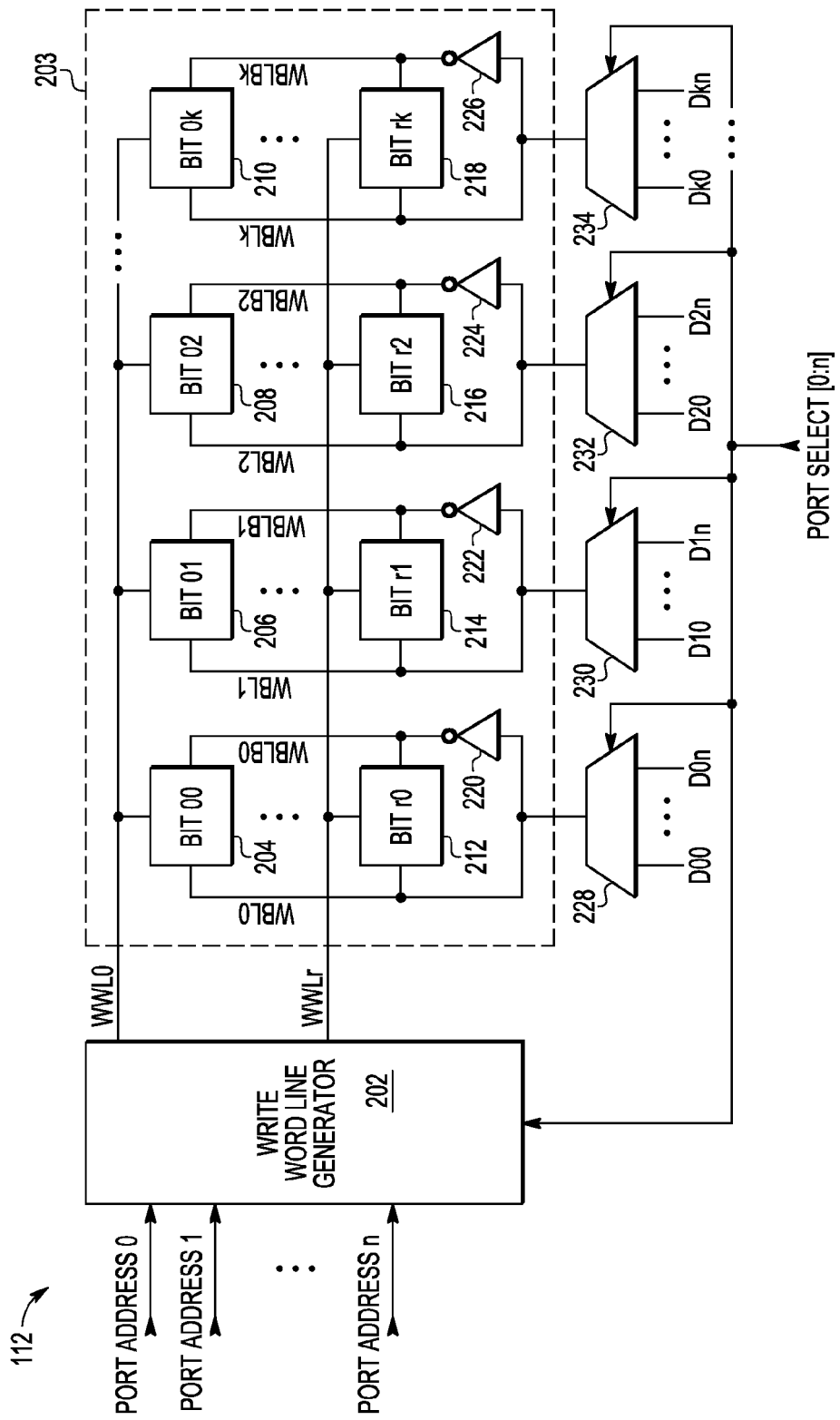
FIG. 2 is a block diagram showing a portion of the system of FIG. 1 in more detail.

Shown in FIG. 2 is register file 112 having a write word line generator 202, a bit cell array 203, a multiplexer 228, a multiplexer 230, a multiplexer, 232, and a multiplexer 234. Bit cell array 203 has bit cells 204, 206, 208, and 210 coupled to a write word line WWL0 and bit cells 212, 214, 216, and 218 coupled to a write word line WWLr, where "r" refers to the number of word lines which may be a power of 2 such as 32 or 64. Bit cell array 230 also includes an inverter 220, an inverter 222, an inverter 224, and an inverter 226. A word line and the bit cells coupled to it may be considered a row. Bit cells 204 and 212 are coupled to write bit line WBL0 and complementary write bit line WBLB0. Bit cells 206 and 214 are coupled to write bit line WBL1 and complementary write bit line WBLB1. Bit cells 208 and 216 are coupled to write bit line WBL2 and complementary write bit line WBLB2. Bit cells 210 and 218 are coupled to write bit line WBLk and complementary write bit line WBLB0k, where "k" is the number of bit line pairs, or, in the case where the cells are each coupled to a single bit line, the number of bit lines. The number k may be considered the number of columns and may be a power of 2 such as 32 or 64. Write word line generator 202 is coupled to the write word lines such as write word lines WWL0 and WWLr and receives a port select signals PS [0:n] in which "n" may be four in which case there would be four port select signals PS [0:n] and that would be number of ports of register file 112. Write word line generator 202 also receives n port addresses in which port address PA [0], port address PA [1], and port address PA [n] are shown in FIG. 2. Inverters 220, 222, 224, and 226 are for providing complementary write signals. Inverter 220 has an input coupled to an output of multiplexer 228 and an output coupled to complementary write bit line WBLB0. Multiplexer 228 receives n data signals which include data signal D00 and data signal D0n. The first number refers to the bit line and the second refers to the port. Thus data signal D00 is the data signal for write bit lines WBL0 and WBLB0 and is for port 0. The data signal for write bit lines WBL1 and WBLB1 would for port 2 would be D12. In the case of n being four, each multiplexer receives four data signals; one for each port. Write word line generator 202 receives addresses for each of the port addresses. The addresses shown are port address PA [0] which is the address for port 0, port address PA [1] which is the address for port 1, and port address n which is the address for the last port, which in the case of n being four would be port address PA [3]. The third port address would be port address 2. Port addresses 1, 2, 3, and 4 are for selecting a word line. The use of inverters 212, 214, 216, and 218 alleviates the need for two multiplexers for each bit line pair, but other considerations may make it beneficial to use two multiplexers per bit line pair and not use inverters 212, 214, 216, and 218.

In a write operation, write word line generator 202 determines which word line is to be enabled based on the address of the port that is selected. Multiplexers 228, 230, 232, and 234 receive the data to be written and coupled the data from the selected port to the bit line pairs. If for example port 1 is selected by port select signal PS [1] being active, then port address PA [1] would select the word line to be enabled which could be, for example, write word line WWL0. With the example of port 1 being selected, the multiplexers such as multiplexers 228, 230, 232, and 234, responsive to the port select signal PS [1], would couple data D01, D11, D21, and Dk1 to write bit lines WBL0, WBL1, WBL2, and WBLk, respectively, and their complements WBLB0, WBLB1, WBLB2, and WBLBk. With this example of port 1 being selected and word line WWL0 being selected by port address PA [1], write word line generator 202 would respond to the port select PS [0:n] selecting port 1 by decoding port address PA [1] and enable word line WWL0. With word line WWL0 being enabled, the data on the bit line pairs would be written into the bit cells coupled to word line WWL0 shown as bit cells 204, 206, 208, and 210.

Figure 3:
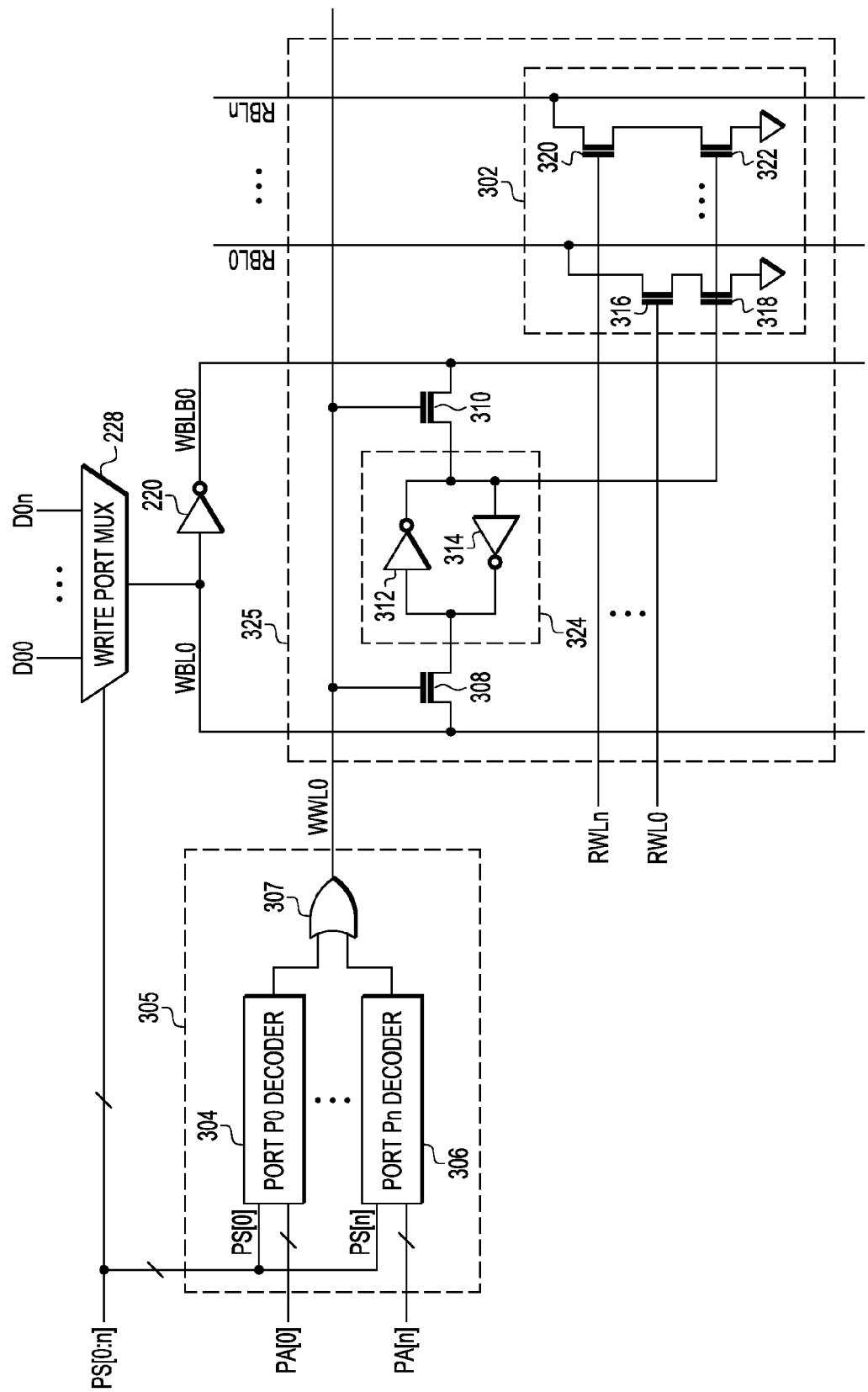
FIG. 3 is a combination block and circuit diagram showing a portion of the portion of FIG. 2 in more detail.

Shown in FIG. 3 is a portion of array 203, word line select 305, which is a portion of write word line generator 202, multiplexer 228, and inverter 220. The portion of array 203 includes a bit cell 204 that includes an N channel transistor 308, an N channel transistor 310, an inverter 312, an inverter 314, and a read circuit 302. The portion of write word line generator 202 includes an OR circuit 307 and a port decoder for each port and FIG. 3 shows port decoder P0 304 and a port decoder Pn 306. There is a portion of write word line generator 202 analogous to word line select 305 in FIG. 3 for each write word line. Each port decoder receives its port select signal and the row address for its port and has an output coupled to an input of OR circuit 307. Of the port decoders, Port decoders P0 and Pn are shown in FIG. 3. Port decoder P0 304 receives row address PA[0] and port select [0] and has an output coupled to an input of OR circuit 307. Port decoder Pn 306 receives row address PA[n] and port select PS [n] and has an output coupled to an input of OR circuit 307. OR circuit 307 has an output coupled to write word line WWL0. Transistor 308 has a gate connected to write word line WWL0, a first current electrode connected to the output of multiplexer 228 which is also write bit line WBL0, and a second current electrode. Memory cell 325 includes transistors 308 and 310, storage unit 324, and read circuit 302. Transistor 308 functions as a pass gate. Inverter 312 has an input connected to the second current electrode of transistor 308 and an output connected to an input of inverter 314. An output of inverter 314 is connected to the input of inverter 312 and the second current electrode of transistor 308. Inverter 220 has an input connected to the output of multiplexer 228 and an output connected to complementary write bit line WBLB0. Transistor 310 has a gate connected to word line WWL0, a first current electrode connected to complementary write bit line WBLB0, and a second current electrode connected to the output of inverter 312 and the input of inverter 314. Transistor 310 functions as a transfer device. Inverters 312 and 314 together form a storage unit 324 that may also be called a latch. Read circuit 302 includes a number of pairs, 0 to n, of N channel transistors. Shown are two pairs including N channel transistors 316, 318, 320, and 322. One pair is made up of transistors 316 and 318. Another pair is made up of transistors 320 and 322. Transistor 316 has a gate for receiving a read port RWL0 signal, a first current electrode connected to a read bit line RBL0, and a second current electrode. Transistor 318 has a gate connected to the output of inverter 312 and the input of the input of inverter 314, a first current electrode connected to the second current electrode of transistor 316, and a second current electrode connected to a negative power supply; in this case ground. The connection between the output of inverter 312 and the input of inverter 314 may be considered the read output of storage unit 324. Transistor 320 has a gate for receiving a read port RWLn signal, a first current electrode connected to a read bit line RBLn, and a second current electrode. Transistor 322 has a gate connected to the output of storage unit 324, a first current electrode connected to the second current electrode of transistor 320, and a second current electrode connected to the negative power supply. Read circuit 302 may operate in conventional fashion.

The portion of write word line generator 202 is exemplified in word line decoders 304 and 306 and OR circuit 307. If word line WWL0 is selected to be enabled, then one of the decoders connected to OR circuit 307 will be selected which will be by a selection by port select [0:n]. WWL0 will then be selected by the selected decoder determining that it has been selected. Write word line decoders P0 and Pn are designed to detect if the address has selected write word line WWL0. Thus, if the address that is received by the selected write word line decoder is for write word line WWL0, then OR circuit 307 will receive an active signal and provide a signal on write word line WWL0 that will enable transistors 308 and 310. With transistors 308 and 310 enabled, the data provided onto write bit lines WBL0 and WBLB0 will be written into storage unit 324. Any write word line decoder that does not receive an active port select signal PS [0:n] will not provide an active output signal regardless of the received address. For example, even if the port decoder P0 304 is receiving the address for write word line WWL0, port decoder P0 304 will not provide an active output if port select signal PS [0] is inactive. Thus each write word line has coupled to it, through an OR circuit, a plurality of decoders that are designed to detect the address for that write word line. In another embodiment, port decoders P0 through Pn do not receive select signal PS [0:n] is instead routed to a multiplexer that receives decoder P0-Pn outputs and outputs WWL.

Figure 4:
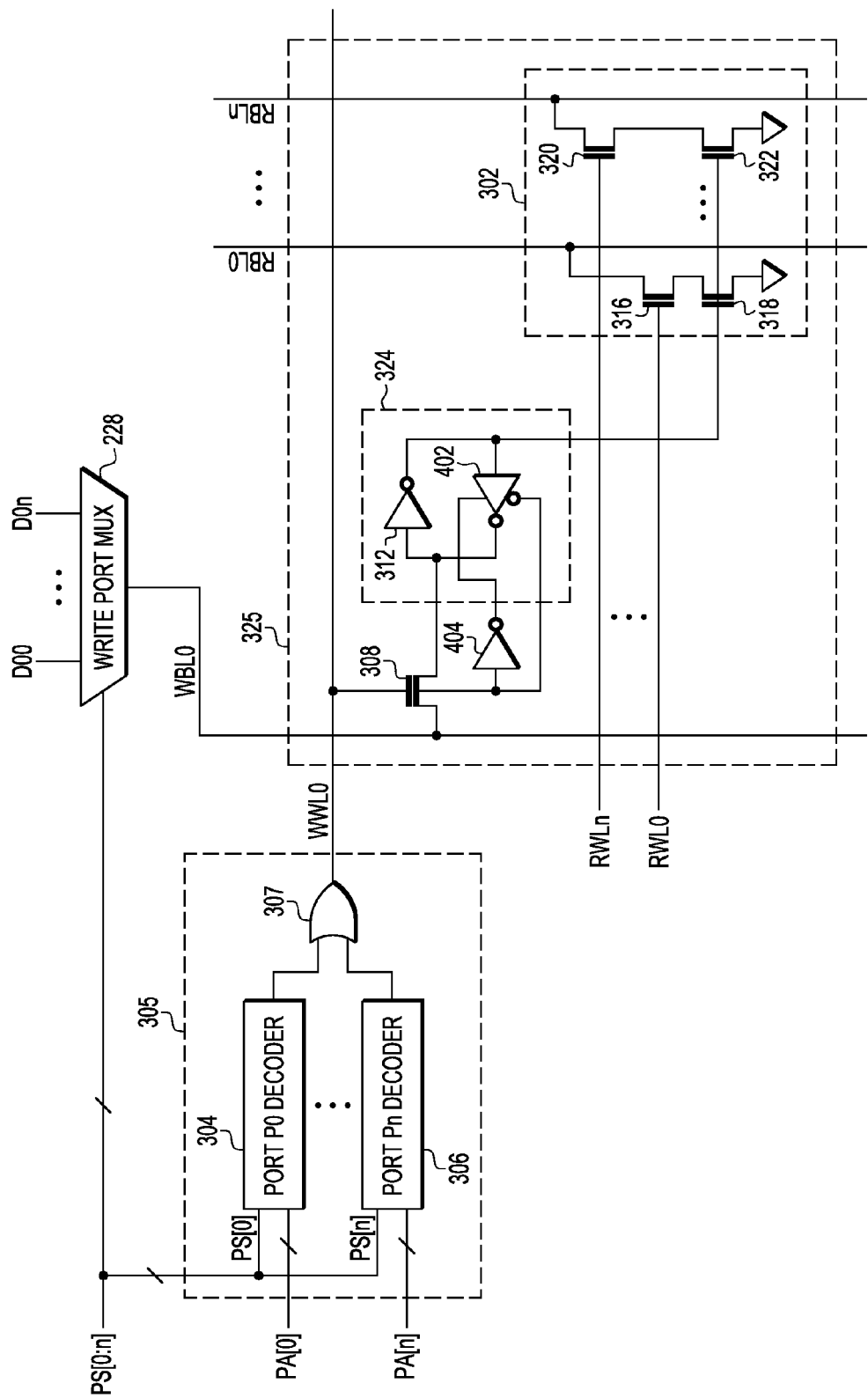
FIG. 4 shows a variation of the portion of FIG. 3.

Shown in FIG. 4 is a variation on the circuit of FIG. 3 by showing that the complementary bit line can be eliminated. Memory cell 325 adds inverter 404, replaces inverter 314 with clocked inverter 402, and removes transistor 310. Inverter 220, for which there is one per bit line, is replaced by an inverter 404 for which there is one per memory cell. Inverter 402 is clocked on a logic low side by write word line WWL0 and on a logic high side by inverter 404 which in turn is coupled to write word line WWL0. A portion of a memory array 401 is thus formed from transistor 308, inverter 312, clocked inverter 402, and inverter 404. A storage unit 406 is formed from inverter 312 and clocked inverter 402. Each bit cell is made up of elements analogous to transistor 308, inverter 312, clocked inverter 402, and inverter 404. Each word line has a transistor analogous to transistor 308. While a bit is being stored in storage unit 324, inverter 402 is enabled by word line WWL0 being inactive which causes the logic high side of inverter 402 to be active and causes inverter 404 to cause the logic low side of inverter 402 to be active. Thus, during storage of a bit, storage unit 406 is a fully functional latch. When write word line WWL0 is activated so that write is to be performed on storage unit 406, the logic high side and the logic low side of inverter 402 are disabled making it easier to cause inverter 312 to change state if necessary to do so. When write word line WWL0 switches back to inactive, then inverter is fully functional as an inverter and provides the needed latching function. Read circuit 302 is not affected because a read will be performed when the write word lines, including write word line WWL0, are inactive so that the state of storage unit 406 is safely latched.

Thus, it seen that a fully functional multi-port memory can be achieved with a single write word line per row and a single write bit line or write bit line pair per column. This can be important in providing reduced area for the array.

By now it should be appreciated that there has been provided a semiconductor memory storage device that includes an array of storage devices including a plurality of rows of the storage devices and a plurality of columns of the storage devices. The semiconductor storage device further includes a first plurality of write ports. The semiconductor storage device further includes a write select signal coupled to the first plurality of write ports. The semiconductor storage device further includes a plurality of write port address lines coupled as input to each write port of the first plurality of write ports. The semiconductor storage device further includes a first plurality of word line select circuits coupled to receive an address signal and the write select signal for each write port of the first plurality of write ports and to provide a single selected write word line signal to a respective one of the rows of the plurality of rows of the storage devices for one write port of the first plurality of write ports activated by the write select signal. The semiconductor memory storage device may further include a plurality of second select circuits and a plurality of data lines coupled as inputs to the plurality of second select circuits, wherein respective ones of the data lines and a respective one of the write port select signal lines are coupled as an input to each second select circuit of the plurality of second select circuits, and the plurality of second select circuits output data from a selected one of the data lines. The semiconductor memory storage device may have a further characterization by which each of the storage devices includes a first pass switch including a control input, a first current electrode and a second current electrode, wherein the control input is connected to the single selected write word line signal, the first current electrode is connected to an output of one of the second select circuits of the plurality of second select circuits, and the second current electrode is connected as input to a first inverter in a storage element. The semiconductor memory storage device may have a further characterization by which each of the storage devices includes a second pass switch including a control input, a first current electrode and a second current electrode, wherein the control input is connected to the selected write word line signal, the first current electrode is connected to an inverse of the output of one of the second select circuits, and the second current electrode is connected as input to a second inverter in a storage element. The semiconductor memory storage device may have a further characterization by which each of the storage devices includes a storage element including a first inverter and a second inverter, wherein an output of the first inverter is provided as input to the second inverter, an output of the second inverter is provided as input to the first inverter. The semiconductor memory storage device may have a further characterization by which each of the storage devices includes a storage element including a first inverter and a second inverter, wherein an output of the first inverter is provided as input to the second inverter, an output of the second inverter is provided as input to the first inverter, the selected write word line signal is provided as a control input to the second inverter, and the selected write word line signal is provided as a second control input to the second inverter. The semiconductor memory storage device may have a further characterization by which the array of storage devices is included in a register file of a computer processing system. The semiconductor memory storage device may have a further characterization by which the first select circuit is an OR gate and the second select circuits are multiplexers. The semiconductor memory storage device may have a further characterization by which at least one of the first and select circuits are operated using a clock signal. The semiconductor memory storage device may further include a plurality of the first select circuits, wherein respective ones of the write port address lines and a respective one of the write port select signal lines are coupled as input to each of the first select circuits, and the first select circuits output a respective selected write word signal to a respective row in the array of storage devices.

Also disclosed is a semiconductor device that includes an array of memory devices including a plurality of rows of the memory devices and a plurality of columns of the memory devices. The semiconductor device further includes a plurality of select circuits. The semiconductor device further includes a plurality of data lines coupled as input to the select circuits, wherein respective ones of the data lines and a respective one of the write port select signal lines are coupled as input to each of the select circuits, and the select circuits output data from one of the data lines. The semiconductor device may further include a plurality of write ports coupled to receive a write select signal, wherein only one of the write ports activates at a time in response to the write select signal, a plurality of write port address lines coupled as input to each of the write ports, a plurality of word line select circuits, wherein a respective one of the plurality of write select circuits outputs a write word line selection signal corresponding to the activated write port, and a plurality of second select circuits, wherein respective ones of the write port address lines and a respective one of the write port select signal lines are coupled as input to each of the second select circuits, and the second select circuits output a respective write word signal to a respective row in the array of memory devices. The semiconductor device may have a further characterization by which each of the memory devices includes a first pass switch including a control input, a first current electrode and a second current electrode, wherein the control input is connected to a selected write word line signal, the first current electrode is connected to the output of one of the select circuits, and the second current electrode is connected as input to a first inverter in a storage element. The semiconductor device may have a further characterization by which each of the memory devices includes a second pass switch including a control input, a first current electrode and a second current electrode, wherein the control input is connected to an inverse of a write word line signal, the first current electrode is connected to an inverse of the output of one of the select circuits, and the second current electrode is connected as input to a second inverter in a storage element. The semiconductor device may have a further characterization by which each of the memory devices includes a storage element including a first inverter and a second inverter, wherein an output of the first inverter is provided as input to the second inverter, an output of the second inverter is provided as input to the first inverter. The semiconductor device may have a further characterization by which each of the memory devices includes a storage element including a first inverter and a second inverter, wherein an output of the first inverter is provided as input to the second inverter, an output of the second inverter is provided as input to the first inverter, a write word line signal is provided as a control input to the second inverter, and the write word line signal is provided as a second control input to the second inverter.

Disclosed also is a method for writing data to an array of memory devices that includes receiving a respective one of a plurality of write port select signals in each of a plurality of write word line decode circuits. The method further includes generating a write word line signal in each of the plurality of write word line decode circuits. The method further includes providing the write word line signals to a plurality of first select circuits. The method further includes selecting a row in the array of memory devices using only one of the write word line signals in the first select circuits. The method further includes receiving a respective one of the plurality of write port select signals in each of a plurality of second select circuits. The method further includes selecting a column in the array of memory devices using only the one of the write port select signals in the second select circuits. The method further includes writing the data in the bit cell array starting at the selected row and column. The method may further include using the one of the write word line signals to control a first pass gate to a storage element at the selected row and column. The method may further include using an inverse of the one of the write word line signals to control a second pass gate to the storage element. The method may further include using the one of the write word line signals as first and second control input to a first inverter in the storage element, wherein an output of the first inverter is provided as an input to a second inverter in the storage element, and an output of the second inverter is provided as an input to the first inverter.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

The terms active and inactive are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Although the disclosure has been described with respect to specific conductivity types or polarity of potentials, skilled artisans appreciated that conductivity types and polarities of potentials may be reversed.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the disclosure. Of course, the description of the architecture has been simplified for purposes of discussion, and it is just one of many different types of appropriate architectures that may be used in accordance with the disclosure. Those skilled in the art will recognize that the boundaries between logic blocks are merely illustrative and that alternative embodiments may merge logic blocks or circuit elements or impose an alternate decomposition of functionality upon various logic blocks or circuit elements.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor memory storage device, comprising:
   an array of storage devices including a plurality of rows of the storage devices and a plurality of columns of the storage devices;
   a first plurality of write ports;
   a write select signal coupled to the first plurality of write ports;
   a plurality of write port address lines coupled as input to each write port of the first plurality of write ports;
   a first plurality of word line select circuits coupled to receive an address signal and the write select signal for each write port of the first plurality of write ports and to provide a single selected write word line signal to a respective one of the rows of the plurality of rows of the storage devices for one write port of the first plurality of write ports activated by the write select signal;
   a plurality of second select circuits; and
   a plurality of data lines coupled as inputs to the plurality of second select circuits, wherein respective ones of the data lines and a respective one of the write select signal lines are coupled as an input to each second select circuit of the plurality of second select circuits, and the plurality of second select circuits output data from a selected one of the data lines, wherein the first select circuit is an OR gate and the second select circuits are multiplexers.

2. The semiconductor memory storage device of claim 1, wherein each of the storage devices comprises:
   a first pass switch including a control input, a first current electrode and a second current electrode, wherein the control input is connected to the single selected write word line signal, the first current electrode is connected to an output of one of the second select circuits of the plurality of second select circuits, and the second current electrode is connected as input to a first inverter in a storage element.

3. The semiconductor memory storage device of claim 1, wherein each of the storage devices comprises:
a second pass switch including a control input, a first current electrode and a second current electrode, wherein the control input is connected to the selected write word line signal, the first current electrode is connected to an inverse of the output of one of the second select circuits, and the second current electrode is connected as input to a second inverter in a storage element.

4. The semiconductor memory storage device of claim 1, wherein each of the storage devices comprises:
a storage element including a first inverter and a second inverter, wherein
an output of the first inverter is provided as input to the second inverter,
an output of the second inverter is provided as input to the first inverter.

5. The semiconductor memory storage device of claim 1, wherein each of the storage devices comprises:
a storage element including a first inverter and a second inverter, wherein
an output of the first inverter is provided as input to the second inverter,
an output of the second inverter is provided as input to the first inverter,
the selected write word line signal is provided as a control input to the second inverter, and
an inversion of the selected write word line signal is provided as a second control input to the second inverter.

6. The semiconductor memory storage device of claim 2, wherein the array of storage devices is included in a register file of a computer processing system.

7. The semiconductor memory storage device of claim 1, further comprising a plurality of the first plurality of word line select circuits, wherein respective ones of the write port address lines and a respective one of the write select signal lines are coupled as input to each of the first select circuits, and the first select circuits output a respective selected write word signal to a respective row in the array of storage devices.

8. A method for writing data to an array of memory devices, the method comprising:
receiving a respective one of a plurality of write port select signals in each of a plurality of write word line decode circuits;
generating a write word line signal in each of the plurality of write word line decode circuits;
providing the write word line signals to a plurality of first select circuits;
selecting a row in the array of memory devices using only one of the write word line signals in the first select circuits;
receiving a respective one of the plurality of write port select signals in each of a plurality of second select circuits;
selecting a column in the array of memory devices using only the one of the write port select signals in the second select circuits; and
writing the data in the bit cell array starting at the selected row and column.

9. The method of claim 8, further comprising:
using the one of the write word line signals to control a first pass gate to a storage element at the selected row and column.

10. The method of claim 9, further comprising:
using an inverse of the one of the write word line signals to control a second pass gate to the storage element.

11. The method of claim 9, further comprising:
using the one of the write word line signals as first and second control input to a first inverter in the storage element, wherein an output of the first inverter is provided as an input to a second inverter in the storage element, and an output of the second inverter is provided as an input to the first inverter.

* * * * *